United States Patent
Eto et al.

(10) Patent No.: US 9,370,920 B2
(45) Date of Patent: Jun. 21, 2016

(54) ELECTROSTATIC CHUCK, MOUNT PLATE SUPPORT, AND MANUFACTURING METHOD OF ELECTROSTATIC CHUCK

(71) Applicant: Kabushiki Kaisha Toshiba, Minato-ku (JP)

(72) Inventors: Hideo Eto, Yokkaichi (JP); Yasuhiro Nojiri, Yokohama (JP); Makoto Saito, Nomi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/198,779

(22) Filed: Mar. 6, 2014

(65) Prior Publication Data

US 2015/0043122 A1     Feb. 12, 2015

(30) Foreign Application Priority Data

Aug. 8, 2013  (JP) ................. 2013-165351

(51) Int. Cl.
| | | |
|---|---|---|
| *H01T 23/00* | (2006.01) | |
| *B32B 37/12* | (2006.01) | |
| *H01L 21/67* | (2006.01) | |
| *H01L 21/683* | (2006.01) | |

(52) U.S. Cl.
CPC ...... *B32B 37/1284* (2013.01); *H01L 21/67103* (2013.01); *H01L 21/6831* (2013.01); *Y10T 156/1002* (2015.01)

(58) Field of Classification Search
USPC ......................................................... 361/234
See application file for complete search history.

(56) References Cited

U.S. PATENT DOCUMENTS

| | | | |
|---|---|---|---|
| 6,820,795 B2 | 11/2004 | Fujii | |
| 7,353,979 B2 | 4/2008 | Fujii et al. | |
| 2013/0027838 A1 | 1/2013 | Hori et al. | |
| 2013/0265690 A1* | 10/2013 | Maeta et al. | ......... 361/234 |

FOREIGN PATENT DOCUMENTS

| | | |
|---|---|---|
| JP | 10-144779 | 5/1998 |
| JP | 10-209256 | 8/1998 |
| JP | 2002-313901 | 10/2002 |
| JP | 2003-80375 | 3/2003 |
| JP | 2003-258072 | 9/2003 |
| JP | 2005-101108 | 4/2005 |

(Continued)

OTHER PUBLICATIONS

Office Action issued Jan. 26, 2016, in Japanese Patent Application No. 2013-165351, filed Aug. 8, 2013 w/English-language Translation.

*Primary Examiner* — Dharti Patel
(74) *Attorney, Agent, or Firm* — Oblon, McClelland, Maier & Neustadt, L.L.P.

(57) ABSTRACT

According to one embodiment, an electrostatic chuck comprises a mount plate, a first layer, and a second layer. The first layer includes a heater. The second layer is provided between the mount plate and the first layer. The second layer transmits heat from the heater to the mount plate. The second layer includes a compressive attachment portion. The compressive attachment portion is formed at the outer edge. The face on the mount plate side of the compressive attachment portion is compressed and attached to the mount plate. The face on the first layer side of the compressive attachment portion is compressed and attached to the first layer.

18 Claims, 9 Drawing Sheets

(56) References Cited

FOREIGN PATENT DOCUMENTS

| | | |
|---|---|---|
| JP | 2008-112763 | 5/2008 |
| JP | 2010-103393 | 5/2010 |
| JP | 2010-129845 | 6/2010 |
| JP | 2011-222977 | 11/2011 |
| JP | 4986830 | 5/2012 |
| WO | WO 2012/090782 A1 | 7/2012 |

* cited by examiner

| MATERIAL | HARDNESS (Hv) | THERMAL CONDUCTIVITY (W/m·K) | LINEAR EXPANSION COEFFICIENT (×10⁻⁶/K) |
|---|---|---|---|
| HIGH-PURITY Al | 20 TO 30 | 200 | 23.1 |
| Al5052 | 82 | 200 | 23.2 |
| Mo | 160 | 147 | 3.7 TO 5.3 |
| Al-SiC | 100 | 160 | 7.7 |
| AlN | 1000 TO 1200 | 150 | 5.0 |
| $Al_2O_3$ | 1500 TO 1800 | 30 TO 40 | 6.5 TO 7.0 |

ELECTROSTATIC CHUCK, MOUNT PLATE SUPPORT, AND MANUFACTURING METHOD OF ELECTROSTATIC CHUCK

CROSS-REFERENCE TO RELATED APPLICATIONS

This application is based upon and claims the benefit of priority from Japanese Patent Application No. 2013-165351, filed on Aug. 8, 2013; the entire contents of all of which are incorporated herein by reference.

FIELD

Embodiments described herein relate generally to an electrostatic chuck, a mount plate support, and a manufacturing method of the electrostatic chuck.

BACKGROUND

Conventionally, an electrostatic chuck to hold a work such as a semiconductor wafer comprises a mount plate on which the work is to be mounted and a support supporting the mount plate. Among electrostatic chucks, there are ones which comprise a heater to heat a work and a heat-uniformizing plate to uniformize heat from the heater that are placed between the base material forming the support and the mount plate. For both the adhesion of the heater and the heat-uniformizing plate and the adhesion of the heat-uniformizing plate and the mount plate, a heat conductive adhesive bond is used. For the adhesion of the heater and the base material, a heat insulating adhesive bond is used. At the outer edge of the mount plate support, there is provided an adhesive bond protecting layer to protect the adhesive layers between the base material and the mount plate sideways.

The degradation of this adhesive bond protecting layer is promoted because of the influence of stress due to the difference in linear expansion coefficient between the mount plate (generally ceramic) and the heat-uniformizing plate (generally aluminum) and erosion by plasma. If the degradation reaches to the adhesive bond layers where heat conductive gas (such as helium) lines or thermo-sensor lines exist, the helium leakage or the vacuum leakage will likely occur, and thus there is the problem that the life time of the electrostatic chuck becomes shorter.

DETAILED DESCRIPTION

In general, according to one embodiment, an electrostatic chuck has a mount plate, a first layer, and a second layer. A work is to be mounted on the mount plate. The first layer includes a heater. The heater supplies heat to the work via the mount plate. The second layer is provided between the mount plate and the first layer. The second layer transmits heat from the heater to the mount plate. The second layer includes a compressive attachment portion. The compressive attachment portion is formed at the outer edge. The face on the mount plate side of the compressive attachment portion is compressed and attached to the mount plate. The face on the first layer side of the compressive attachment portion is compressed and attached to the first layer.

Exemplary embodiments of an electrostatic chuck, a mount plate support, and a manufacturing method of the electrostatic chuck will be explained below in detail with reference to the accompanying drawings. The present invention is not limited to the following embodiments.

First Embodiment

Figure 1:
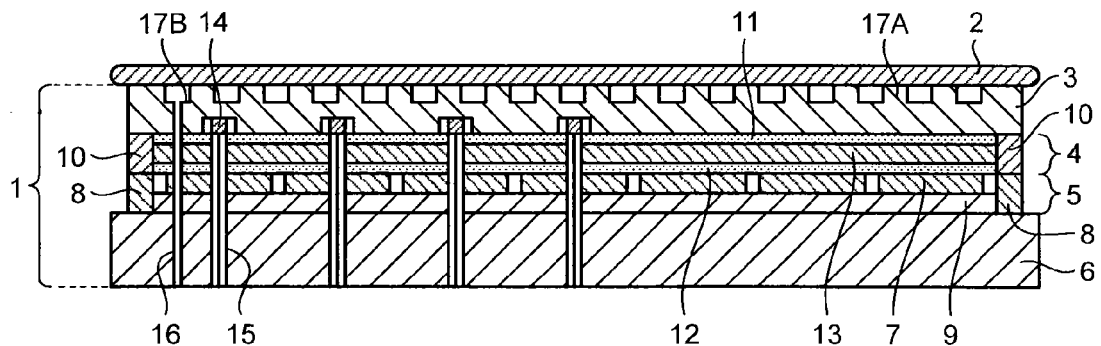
FIG. 1 is a cross-sectional view schematically showing the configuration of the electrostatic chuck according to a first embodiment.
Figure 2:
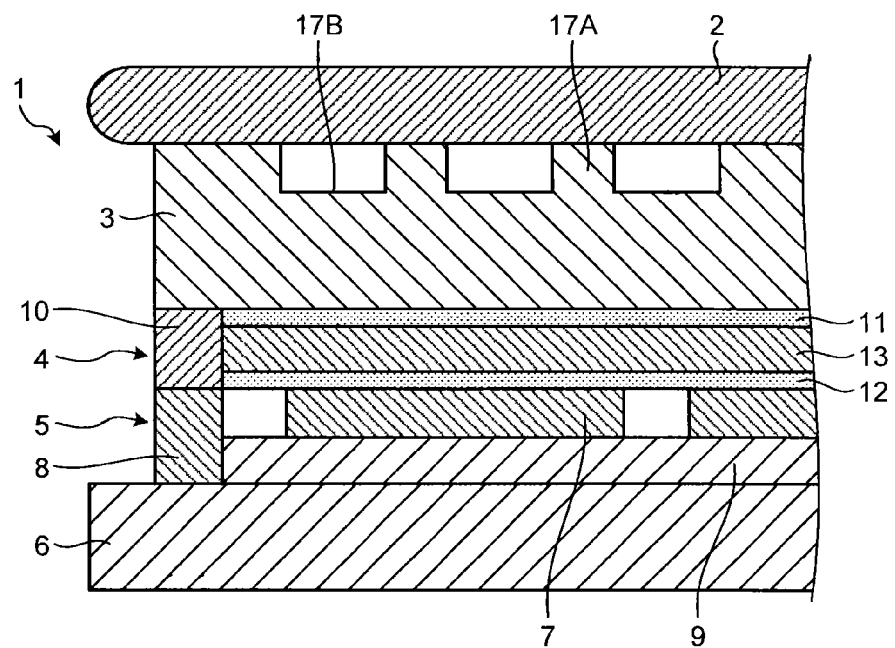
FIG. 2 is an enlarged view showing part including the outer edge of the electrostatic chuck shown in FIG. 1.

FIG. 1 is a cross-sectional view schematically showing the configuration of the electrostatic chuck according to the first embodiment. FIG. 2 is an enlarged view showing part including the outer edge of the electrostatic chuck shown in FIG. 1. Note that in the figures cited below, the scale for each member may be different and that the same is true for the same member in the different figures.

The electrostatic chuck 1 comprises a ceramic plate 3 that is a mount plate, a base material 6, a first layer 5, and a second layer 4. The base material 6, the first layer 5, and the second layer 4 form a mount plate support that supports the ceramic plate 3.

A work 2 such as a semiconductor wafer is mounted on the ceramic plate 3. The ceramic plate 3 is made of a ceramic material such as $Al_2O_3$ or AlN. The mount plate is not only limited to plates made of various ceramic materials, but also may be made of any other material such as resin. Convexes 17A are formed in the surface of the ceramic plate 3 on which the work 2 is mounted. Concaves 17B refer to parts between adjacent ones of the convexes 17A.

The base material 6 is made of a heat conductive material such as Al5052 or Al6061. The first layer 5 includes a heat insulating adhesive bond layer 9, a heater 7, and a heat insulating layer 8. The heater 7 supplies heat to the work 2 via the second layer 4 and the ceramic plate 3.

The heat insulating adhesive bond layer 9 is provided between the base material 6 and the heater 7. The heat insulating adhesive bond layer 9 bonds the base material 6 and the heater 7 together and block the heat conduction from the heater 7 to the base material 6. The heat insulating layer 8 is provided at the outer edge of the first layer 5. The heat insulating layer 8 blocks the heat conduction from the side of the heater 7 to the base material 6. The heat insulating layer 8 is formed of, e.g., a ceramic material.

The second layer 4 is provided between the ceramic plate 3 and the first layer 5. The second layer 4 transmits heat from the heater 7 to the ceramic plate 3. The second layer 4 comprises heat conductive adhesive bond layers 11, 12, a metal plate 13, and a compressive attachment portion 10.

The metal plate 13 that is a heat-uniformizing plate uniformizes heat from the heater 7. The heat conductive adhesive bond layer 11 that is a first adhesive portion is provided between the ceramic plate 3 and the metal plate 13. The heat conductive adhesive bond layer 11 bonds the ceramic plate 3 and the metal plate 13 together and transmits heat which uniformized by the metal plate 13 to the ceramic plate 3.

The heat conductive adhesive bond layer 12 that is a second adhesive portion is provided between the metal plate 13 and the heater 7. The heat conductive adhesive bond layers 12 bonds the metal plate 13 and the heater 7 together and transmits heat from the heater 7 to the metal plate 13.

The compressive attachment portion 10 is formed at the outer edge of the second layer 4. The compressive attachment portion 10 is formed of metal materials. The face on the ceramic plate 3 side of the compressive attachment portion 10 is compressed and attached to the ceramic plate 3. The face on the first layer 5 side of the compressive attachment portion 10 is compressed and attached to the heat insulating layer 8 of the first layer 5.

A helium supply line 16 is a flow passage for supplying helium gas that is heat conductive gas from the base material 6 side to the concaves 17B of the ceramic plate 3. Temperature sensors 14 measure temperatures in the ceramic plate 3. The electrostatic chuck 1 adjusts the temperature of the heater 7 according to the results of measured temperatures by the temperature sensors 14. The wires connected to the temperature sensors 14 are led out of the base material 6 through atmosphere routes 15.

Figures 3, 4:
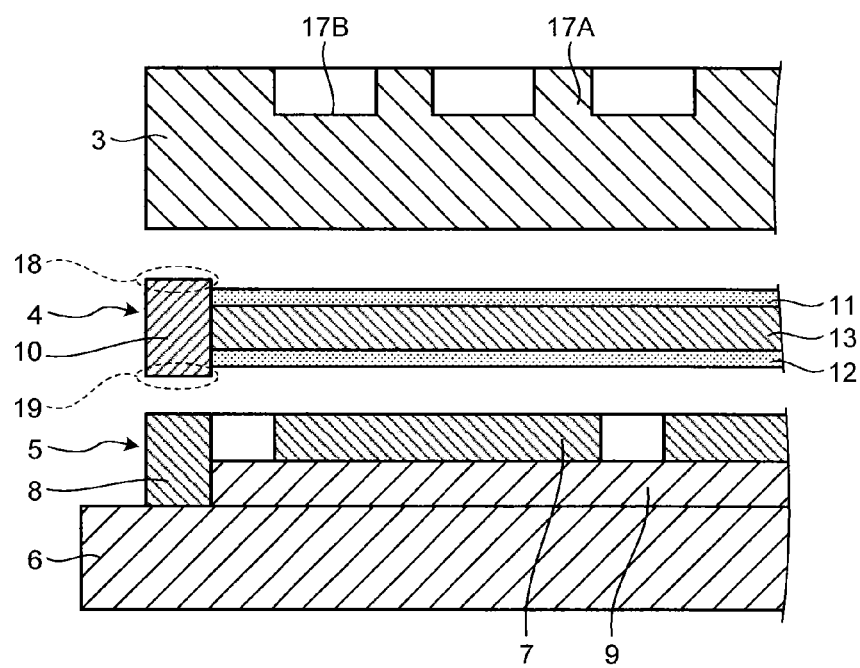
FIG. 3 is a diagram showing the state before a second layer is bonded to a ceramic plate and a first layer in the production process of the electrostatic chuck.
FIG. 4 is a figure showing examples of physical properties of materials.

FIG. 3 is a diagram showing the state before the second layer is bonded to the ceramic plate and the first layer in the manufacturing process of the electrostatic chuck. The compressive attachment portion 10 is formed by deforming the metal member by pressing between the ceramic plate 3 and the heat insulating layer 8 when the second layer 4 is bonded, in between, to the ceramic plate 3 and the first layer 5.

The second layer 4 is prepared in such a way that a metal member that is to become the compressive attachment portion 10 is provided at the outer edge of the laminated body formed of the heat conductive adhesive bond layer 11, the metal plate 13, and the heat conductive adhesive bond layer 12. Part of this metal member which is to abut on the ceramic plate 3 is a protrusion 18 further out than the surface to bond to the ceramic plate 3 of the heat conductive adhesive bond layer 11. The end face of this protrusion 18 is the compressive attachment surface which is to be compressed and attached to the ceramic plate 3.

Part of the metal member which is to abut on the heat insulating layer 8 is a protrusion 19 further out than the surface to bond to the heater 7 of the heat conductive adhesive bond layer 12. The end face of this protrusion 19 is the compressive attachment surface which is to be compressed and attached to the heat insulating layer 8.

The second layer 4 is prepared in such a way that with the protrusions 18, 19 at the top and bottom of the metal member respectively, the second layer 4 is thicker at the outer edge than at the other part. When the second layer 4 is bonded to the first layer 5 and the ceramic plate 3 is to the second layer 4, the end face of the protrusion 18 is compressed and attached to the ceramic plate 3, and the end face of the protrusion 19 is to the first layer 5.

By pressing the protrusion 18 against the ceramic plate 3 to deform, the outer edge of the second layer 4 is compressed and attached to the ceramic plate 3. By pressing the protrusion 19 against the heat insulating layer 8 of the first layer 5 to deform, the outer edge of the second layer 4 is compressed and attached to the heat insulating layer 8. By this means, the compressive attachment portion 10 is formed.

FIG. 4 is a figure showing examples of physical properties of metal materials in the form of a table. The metal material forming the compressive attachment portion 10 needs to be so low in hardness as to be deformable by pressing it between the ceramic plate 3 and the first layer 5. In the metal materials shown in FIG. 4, for example, high-purity Al is suitable as the material to form the compressive attachment portion 10, because its hardness is low. Further, using high-purity Al can reduce the influence of contaminations. Note that the compressive attachment portion 10 can be made of any other metal material which is not described in this table as examples in the present embodiment, and that further the compressive attachment portion 10 can be made of any material other than metal materials.

The metal material forming the metal plate 13 is desirably high in thermal conductivity for the purpose of transmitting heat from the heater 7 to the ceramic plate 3 efficiently. Further, the difference in linear expansion coefficient between the metal plate 13 and the ceramic plate 3 is desirably small for the purpose of reducing the influence of stress due to the difference in linear expansion coefficient from the ceramic plate 3.

In the metal materials shown in FIG. 4, for example, Mo and Al—SiC are suitable as material to form the metal plate 13 in that its thermal conductivity is relatively high and that the difference in linear expansion coefficient from the ceramic plate 3 is small. Note that the metal plate 13 can be made of any other metal material which is not described in this table as examples in the present embodiment.

According to the first embodiment, as to the electrostatic chuck 1, by compression attaching the compressive attachment portion 10 to the ceramic plate 3, the outer edge of the second layer 4 is firmly fixed to the ceramic plate 3.

As to the electrostatic chuck 1, by compression attaching the compressive attachment portion 10 to the first layer 5, the outer edge of the second layer 4 is firmly fixed to the first layer 5. Because the electrostatic chuck 1 comprises the compressive attachment portion 10 having undergone deformation by pressing, the second layer 4 and the ceramic plate 3, and the second layer 4 and the first layer 5 are firmly in intimate contact.

Thus, as to the electrostatic chuck 1, a space between the outer edge of the second layer 4 and the first layer 5, and a space between the outer edge of the second layer 4 and the ceramic plate 3, is rarely produced. Hence, degradation proceeding from the outer edge can be suppressed.

As compared with the case, where the outer edge of the second layer 4 is protected by an adhesion protecting layer made of materials such as epoxy resin, elastomer, or the like, plasma damages of the electrostatic chuck 1 can be greatly suppressed by providing the compressive attachment portion 10.

The electrostatic chuck 1 can also suppress the stress damage, which is caused by the difference in thermal expansion between the ceramic plate 3 and the metal plate 13.

The electrostatic chuck 1 can effectively suppress gas leakage from the helium supply line 16 and vacuum leakage to the atmosphere routes 15. These leakages are caused when a plasma damage of the heat conductive adhesive bond layers 11, 12 or the heat insulating adhesive layer 9 reaches to the helium supply line 16 or the atmosphere routes 15. The compressive attachment portion 10 can suppress the plasma damage. As a result, the electrostatic chuck 1 can suppress gas leakage, and elongate the life time. The electrostatic chuck 1 can also reduce the frequency of replacement due to the longer life time.

Corrosion resistance and wear resistance may be improved by performing surface processing such as anodizing on the side surface of the compressive attachment portion 10 that is part of the outside of the electrostatic chuck 1. By this means, the electrostatic chuck 1 can further suppress degradation proceeding from the compressive attachment portion 10.

Second Embodiment

Figure 5:
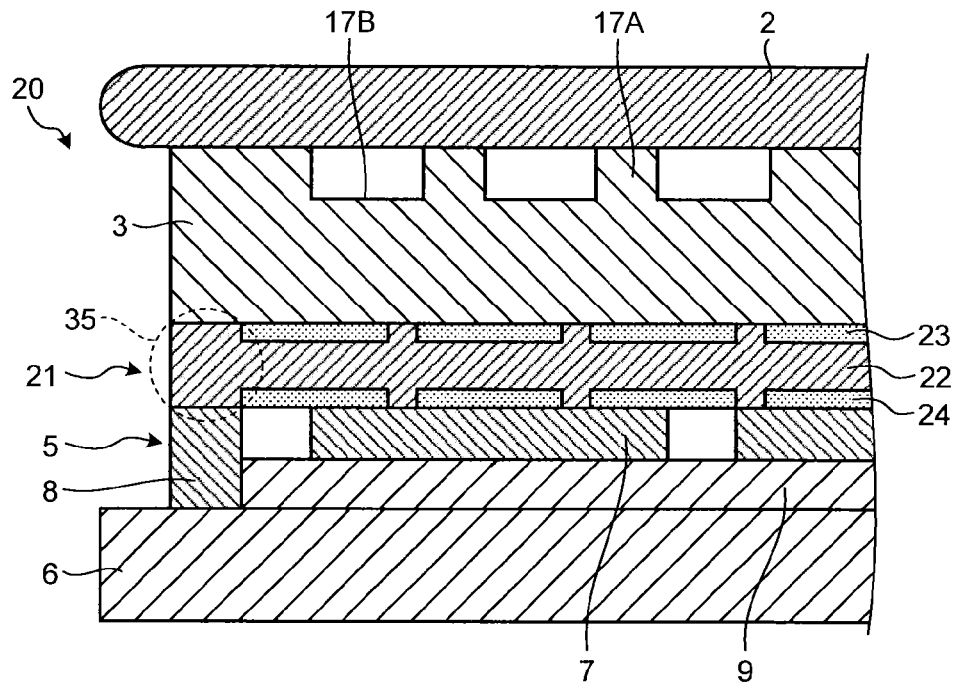
FIG. 5 is a cross-sectional view schematically showing part of the configuration of the electrostatic chuck according to a second embodiment.

FIG. 5 is a cross-sectional view schematically showing part of the configuration of the electrostatic chuck according to the second embodiment. The same reference numerals are used to denote the same parts as in the first embodiment, and a duplicate description is omitted as needed.

The electrostatic chuck 20 comprises a ceramic plate 3, a base material 6, a first layer 5, and a second layer 21. The base material 6, the first layer 5, and the second layer 21 form a mount plate support that supports the ceramic plate 3.

The second layer 21 is provided between the ceramic plate 3 and the first layer 5. The second layer 21 transmits heat from the heater 7 to the ceramic plate 3. The second layer 21 comprises a metal plate 22 and heat conductive adhesive bond layers 23, 24.

The metal plate 22 uniformizes heat from the heater 7. A compressive attachment portion 35 is part of the metal plate 22. The compressive attachment portion 35 is the outer edge of the metal plate 22. The compressive attachment portion 35 is formed at the outer edge of the second layer 21. The face on the ceramic plate 3 side of the compressive attachment portion 35 is compressed and attached to the ceramic plate 3. The face on the first layer 5 side of the compressive attachment portion 35 is compressed and attached to the heat insulating layer 8 of the first layer 5.

The heat conductive adhesive bond layer 23 that is a first adhesive portion is provided in the surface on the ceramic plate 3 side of the second layer 21. The surface on the ceramic plate 3 side of the second layer 21 is formed of parts of the heat conductive adhesive bond layer 23 and exposed parts of the metal plate 22 so as to form a pattern. As such, the surface on the ceramic plate 3 side of the second layer 21 is formed of the metal plate 22 and the heat conductive adhesive bond layer 23.

The heat conductive adhesive bond layer 23 bonds the metal plate 22 and the ceramic plate 3 together. At parts of the surface on the ceramic plate 3 side of the second layer 21 where a part of the heat conductive adhesive bond layer 23 is provided, heat from the metal plate 22 is transmitted via the heat conductive adhesive bond layer 23 to the ceramic plate 3.

At parts of the surface on the ceramic plate 3 side of the second layer 21 where a part of the metal plate 22 is exposed, heat from the metal plate 22 is transmitted directly to the ceramic plate 3.

The heat conductive adhesive bond layer 24 that is a second adhesive portion is provided in the surface on the heater 7 side of the second layer 21. The surface on the heater 7 side of the second layer 21 is formed of parts of the heat conductive adhesive bond layer 24 and exposed parts of the metal plate 22 so as to form a pattern. As such, the surface on the first layer 5 side of the second layer 21 is formed of the metal plate 22 and the heat conductive adhesive bond layer 24.

The heat conductive adhesive bond layer 24 bonds the metal plate 22 and the first layer 5 together. At parts of the surface on the first layer 5 side of the second layer 21 where a part of the heat conductive adhesive bond layer 24 is provided, heat from the heater 7 is transmitted via the heat conductive adhesive bond layer 24 to the metal plate 22. At parts of the surface on the first layer 5 side of the second layer 21 where a part of the metal plate 22 is exposed, heat from the heater 7 is transmitted directly to the metal plate 22.

The pattern of the metal plate 22 and the heat conductive adhesive bond layer 23 in the surface on the ceramic plate 3 side of the second layer 21 and the pattern of the metal plate 22 and the heat conductive adhesive bond layer 24 in the surface on the first layer 5 side may be the same or different as needed.

Figure 6:
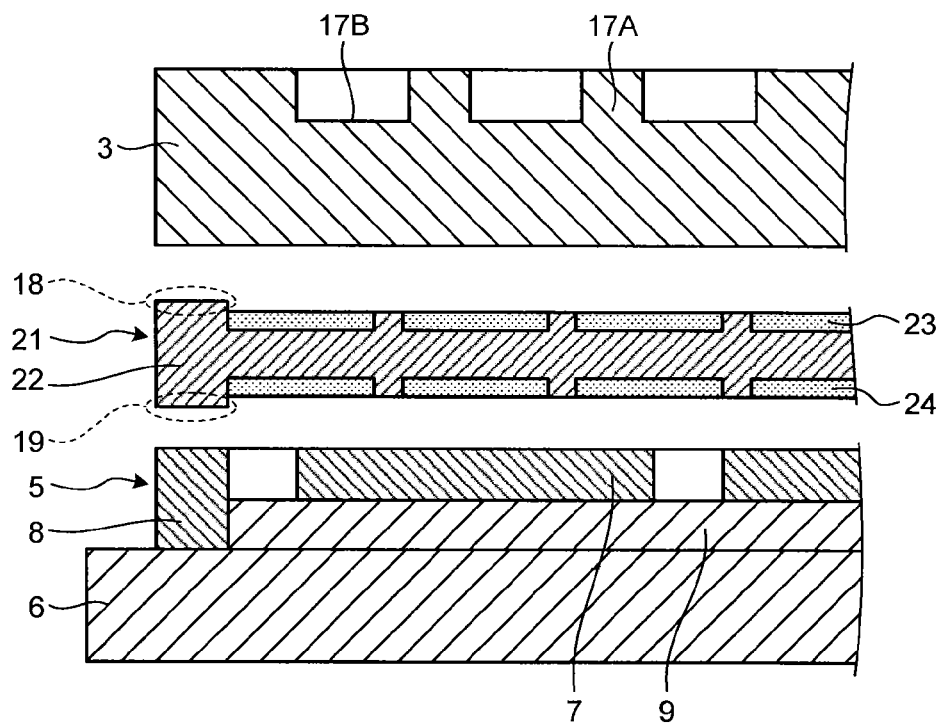
FIG. 6 is a diagram showing the state before a second layer is bonded to a ceramic plate and a first layer in the manufacturing process of the electrostatic chuck.

FIG. 6 is a diagram showing the state before the second layer is bonded to the ceramic plate and the first layer in the manufacturing process of the electrostatic chuck. The compressive attachment portion 35 of the metal plate 22 is formed by deforming the outer edge of the metal plate 22 by pressing between the ceramic plate 3 and the heat insulating layer 8 when the second layer 21 is bonded, in between, to the ceramic plate 3 and the first layer 5.

The metal plate 22 has the patterns of the heat conductive adhesive bond layers 23, 24 all over it except the outer edge. Part of the outer edge of the metal plate 22 which is to abut on the ceramic plate 3 is a protrusion 18 further out than the other part than the outer edge. The end face of this protrusion 18 is the compressive attachment surface which is to be compressed and attached to the ceramic plate 3.

Part of the outer edge of the metal plate 22 which is to abut on the heat insulating layer 8 is a protrusion 19 further out than the other part than the outer edge. The end face of this protrusion 19 is the compressive attachment surface which is to be compressed and attached to the heat insulating layer 8.

The second layer 21 is prepared in such a way that with the protrusions 18, 19 at the top and bottom of the outer edge of the metal plate 22 respectively, the second layer 21 is thicker at the outer edge than at the other part. When the second layer 21 is bonded to the first layer 5 and the ceramic plate 3 is to the second layer 21, the end face of the protrusion 18 is compressed and attached to the ceramic plate 3, and the end face of the protrusion 19 is to the first layer 5.

By pressing the protrusion 18 against the ceramic plate 3 to deform, the outer edge of the metal plate 22 is compressed and attached to the ceramic plate 3. By pressing the protrusion 19 against the heat insulating layer 8 of the first layer 5 to deform, the outer edge of the second layer 21 is compressed and attached to the heat insulating layer 8. By this means, the compressive attachment portion 35 is formed.

The other part of the second layer 21 than the compressive attachment portion 35 can be not completely in intimate contact with at least either of the ceramic plate 3 and the first layer 5. In this case, the electrostatic chuck 20 can lessen distortion or the like due to the difference in linear expansion coefficient.

The metal material forming the metal plate 22 needs to be so low in hardness as to be deformable by pressing it between the ceramic plate 3 and the first layer 5. Further, the metal plate 22 is desirably high in thermal conductivity for the purpose of transmitting heat from the heater 7 to the ceramic plate 3 efficiently. Of the metal materials shown in FIG. 4, for example, high-purity Al is suitable as material to form the metal plate 22 in that its hardness is low and that its thermal conductivity is high. Further, using high-purity Al can reduce the influence of contaminations.

The difference in linear expansion coefficient between the metal plate 22 and the ceramic plate 3 is desirably small for the purpose of reducing the influence of stress due to the difference in linear expansion coefficient from the ceramic plate 3. If the difference in linear expansion coefficient from the ceramic plate 3 being small is regarded as important, Al—SiC may be used as material to form the metal plate 22. Al—SiC is suitable as material to form the metal plate 22 in that its hardness is relatively low and that its thermal conductivity is relatively high. Note that the metal plate 22 may be made of any metal material other than those cited as examples in the present embodiment.

According to the second embodiment, as to the electrostatic chuck 20, by compression attaching the compressive attachment portion 35 to the ceramic plate 3, the outer edge of the metal plate 22 is firmly fixed to the ceramic plate 3. As to the electrostatic chuck 20, by compression attaching the compressive attachment portion 35 to the first layer 5, the outer edge of the metal plate 22 is firmly fixed to the first layer 5. Because the electrostatic chuck 20 comprises the compressive attachment portion 35 having undergone deformation by pressing, the second layer 21 and the ceramic plate 3, and the second layer 21 and the first layer 5 are firmly in intimate contact. Thus, as to the electrostatic chuck 20, a space between the outer edge of the second layer 21 and the first layer 5, and a space between the outer edge of the second layer 21 and the ceramic plate 3, are rarely produced. Hence, degradation proceeding from the outer edge can be suppressed.

Plasma damages are greatly suppressed because the electrostatic chuck 20 comprises the metal plate 22 having the compressive attachment portion 35 formed thereon, as compared with the case where the outer edge of the second layer 21 is protected by an adhesion protecting layer made of materials such as epoxy resin, an elastomer, or the like.

The electrostatic chuck 20 can also suppress the stress damage, which is caused by the difference in thermal expansion between the ceramic plate 3 and the metal plate 22. Thus, the electrostatic chuck 20 produces the effect of longer life time.

Further, in the electrostatic chuck 20, because the surface on the ceramic plate 3 side of the second layer 21 is formed of the metal plate 22 and the heat conductive adhesive bond layer 23, thermal conductivity from the metal plate 22 to the ceramic plate 3 can be improved as compared with the case where the surface on the ceramic plate 3 side is formed of only the heat conductive adhesive bond layer 23.

In the electrostatic chuck 20, because the surface on the first layer 5 side of the second layer 21 is formed of the metal plate 22 and the heat conductive adhesive bond layer 24, thermal conductivity from the heater 7 to the metal plate 22 can be improved as compared with the case where the surface on the first layer 5 side is formed of only the heat conductive adhesive bond layer 24. Thus, in the electrostatic chuck 20, thermal conductivity from the heater 7 to the ceramic plate 3 can be improved.

Corrosion resistance and wear resistance may be improved by performing surface processing such as anodizing on the side surface of the compressive attachment portion 35 that is part of the outside of the electrostatic chuck 20. By this means, the electrostatic chuck 20 can further suppress degradation proceeding from the compressive attachment portion 35.

Third Embodiment

Figure 7:
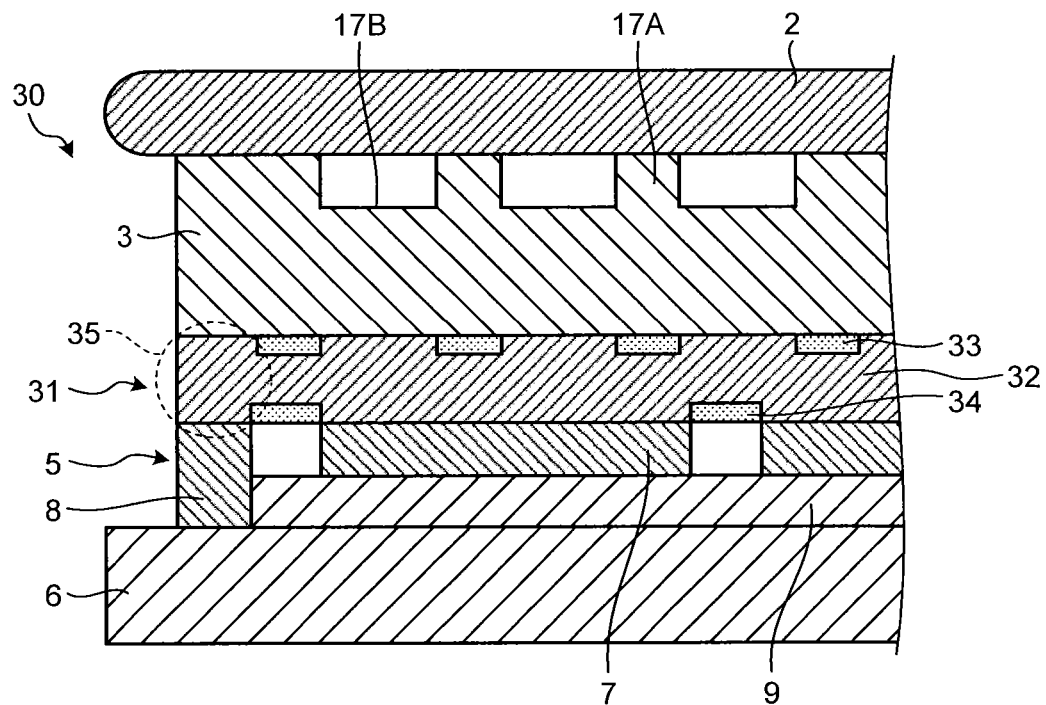
FIG. 7 is a cross-sectional view schematically showing part of the configuration of the electrostatic chuck according to a third embodiment.

FIG. 7 is a cross-sectional view schematically showing part of the configuration of the electrostatic chuck according to the third embodiment. The same reference numerals are used to denote the same parts as in the first embodiment, and a duplicate description is omitted as needed.

The electrostatic chuck 30 comprises a ceramic plate 3, a base material 6, a first layer 5, and a second layer 31. The base material 6, the first layer 5, and the second layer 31 form a mount plate support that supports the ceramic plate 3.

The second layer 31 is provided between the ceramic plate 3 and the first layer 5. The second layer 31 transmits heat from the heater 7 to the ceramic plate 3. The second layer 31 comprises a metal plate 32 and heat conductive adhesive bond layers 33, 34.

The metal plate 32 uniformizes heat from the heater 7. A compressive attachment portion 35 is part of the metal plate 32. The compressive attachment portion 35 is the outer edge of the metal plate 32. The compressive attachment portion 35 is formed at the outer edge of the second layer 31. The face on the ceramic plate 3 side of the compressive attachment portion 35 is compressed and attached to the ceramic plate 3. The face on the first layer 5 side of the compressive attachment portion 35 is compressed and attached to the heat insulating layer 8 of the first layer 5.

The heat conductive adhesive bond layer 33 that is a first adhesive portion is provided in the surface on the ceramic plate 3 side of the second layer 31. The surface on the ceramic plate 3 side of the second layer 31 is formed of parts of the heat conductive adhesive bond layer 33 and exposed parts of the metal plate 32 so as to form a pattern. As such, the surface on the ceramic plate 3 side of the second layer 31 is formed of the metal plate 32 and the heat conductive adhesive bond layer 33.

The heat conductive adhesive bond layer 34 that is a second adhesive portion is provided in the surface on the heater 7 side of the second layer 31. The surface on the heater 7 side of the second layer 31 is formed of parts of the heat conductive adhesive bond layer 34 and exposed parts of the metal plate 32 so as to form a pattern. As such, the surface on the first layer 5 side of the second layer 31 is formed of the metal plate 32 and the heat conductive adhesive bond layer 34.

The pattern of the metal plate 32 in the surface on the ceramic plate 3 side of the second layer 31 coincides with the pattern of the concaves 17B of the ceramic plate 3. The pattern of the metal plate 32 in the surface on the first layer 5 side of the second layer 31 coincides with the pattern of the heater 7.

Figure 8:
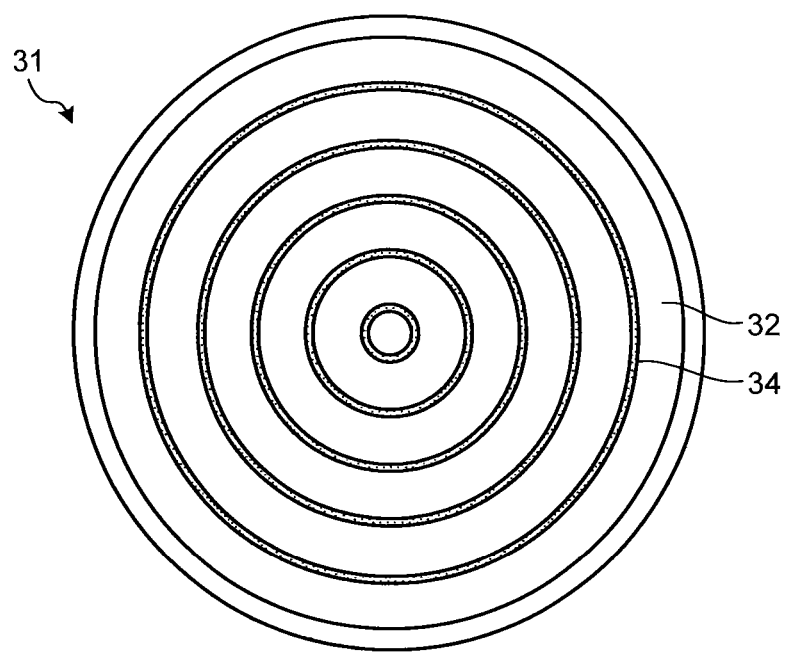
FIG. 8 is a plan view showing the surface on the first layer side of the second layer.

FIG. 8 is a plan view showing the surface on the first layer side of the second layer. The heater 7 is formed in, e.g., a concentric-circles-shaped pattern. In the surface on the first layer 5 side of the second layer 31, the metal plate 32 is in the same concentric-circles-shaped pattern as the heater 7. The heat conductive adhesive bond layer 34 is provided between the pattern features of the metal plate 32. As such, the second layer 31 is made appropriate such that the pattern of the metal plate 32 in the surface on the first layer 5 side thereof coincides with the pattern of the heater 7.

Figure 9:
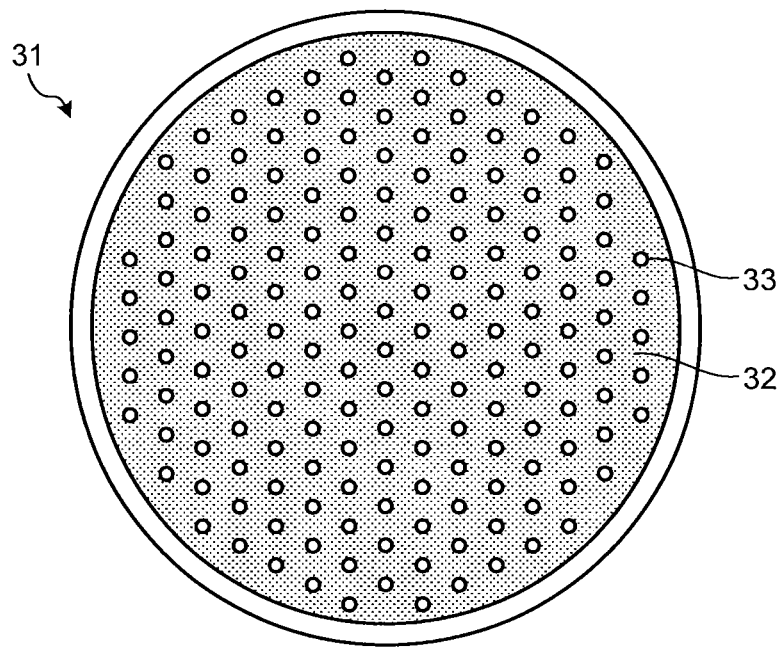
FIG. 9 is a plan view showing the surface on the ceramic plate side of the second layer.
Figure 10:
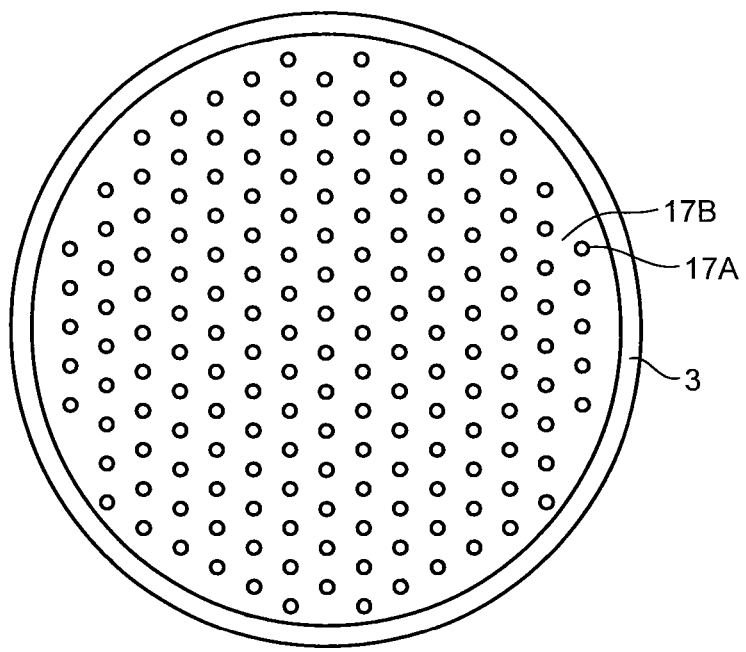
FIG. 10 is a plan view showing the surface of the ceramic plate on which a work is to be mounted.

FIG. 9 is a plan view showing the surface on the ceramic plate side of the second layer. FIG. 10 is a plan view showing the surface of the ceramic plate on which a work is to be mounted. As shown in, e.g., FIG. 10, convexes 17A are arranged in a dot pattern in the ceramic plate 3. In the surface on the ceramic plate 3 side of the second layer 31, the heat conductive adhesive bond layer 33 is in the same dot pattern as the convexes 17A. The metal plate 32 lies between the pattern features of the heat conductive adhesive bond layer 33. As such, the second layer 31 is made appropriate such that the pattern of the metal plate 32 in the surface on the ceramic plate 3 side thereof coincides with the pattern of the concaves 17B.

According to the third embodiment, the electrostatic chuck 30 can elongate the life time as the electrostatic chuck 20 of the second embodiment can and improve thermal conductivity from the heater 7 to the ceramic plate 3.

By making the pattern of the metal plate 32 in the surface on the first layer 5 side of the second layer 31 be appropriate, the electrostatic chuck 30 can further efficiently transmit heat from the heater 7 to the metal plate 32. In a work 2 which mounted on the ceramic plate 3, heat transmission of the area over the concaves 17B is smaller than that of the area contacted to the convexes 17A.

By making the pattern of the metal plate 32 in the surface on the ceramic plate 3 side of the second layer 31 appropriately, the electrostatic chuck 30 promotes transmission of heat to the concaves 17B of the ceramic plate 3. Thus, the electrostatic chuck 30 can transmit heat uniformly to the entire work 2.

The surface pattern of the metal plate 32 in the electrostatic chuck 30, one side of which is attached to the first layer 5 and the other side of which is attached on the second layer 31, may be properly changed in order to improve temperature uniformity to the entire work 2.

Fourth Embodiment

Figure 11:
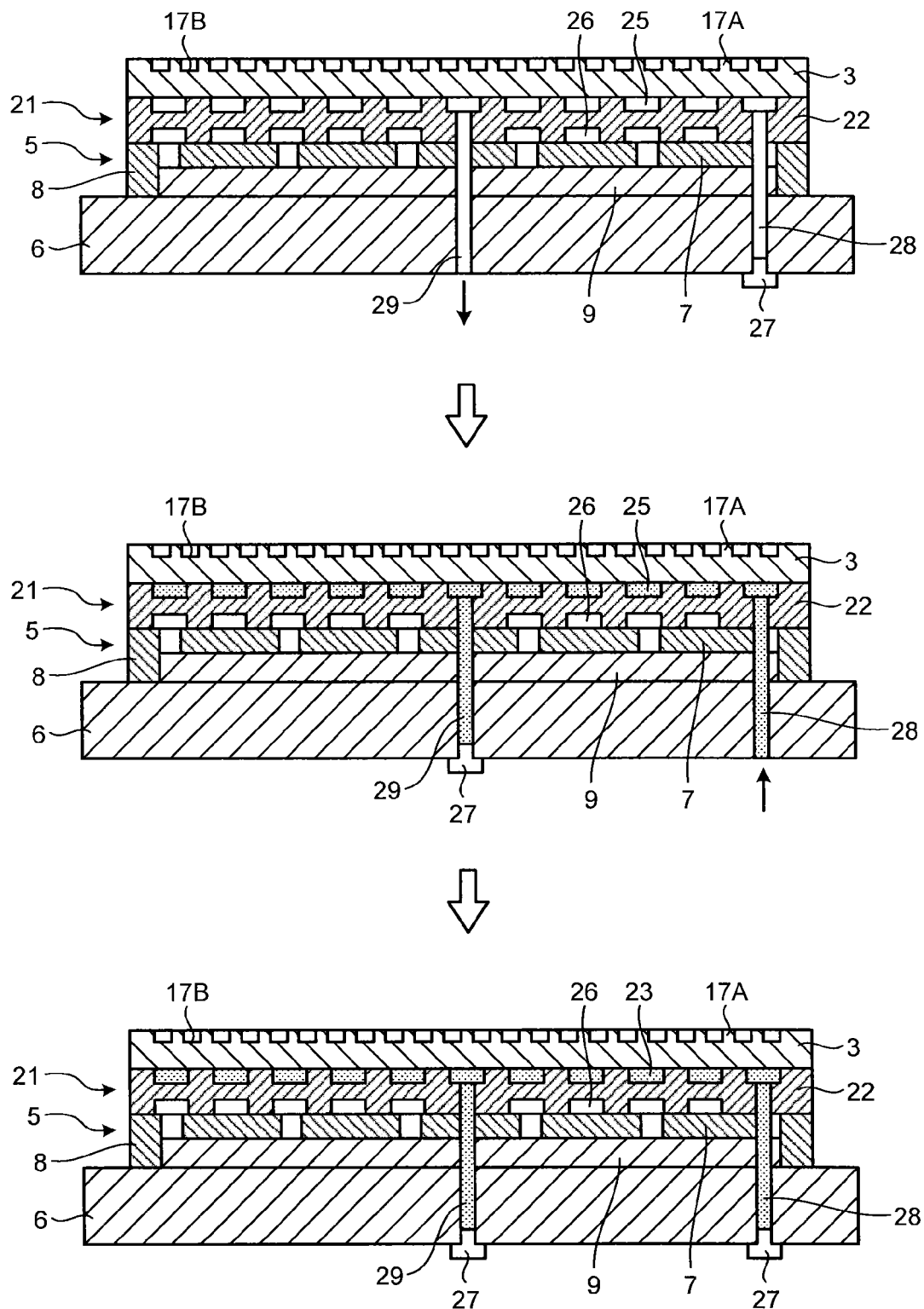
FIG. 11 is a diagram showing the manufacturing method of the electrostatic chuck according to a fourth embodiment.

In the fourth embodiment, an example of the manufacturing method of the electrostatic chuck 20 according to the second embodiment will be described. FIG. 11 is a diagram showing the manufacturing method of the electrostatic chuck according to the fourth embodiment. Here, the procedure of bonding the second layer 21 and the ceramic plate 3 together is taken as an example.

Figure 12:
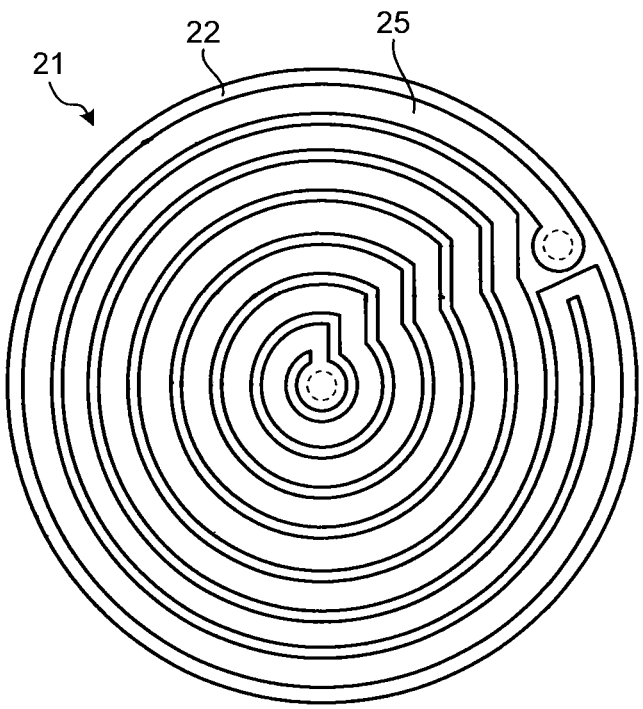
FIG. 12 is a plan view showing the surface on the ceramic plate side of the second layer.

FIG. 12 is a plan view showing the surface on the ceramic plate side of the second layer. In the surface on the ceramic plate 3 side of the metal plate 22, a flow passage 25 to fill an adhesive bond into is formed. The flow passage 25 is formed to conform to the pattern of the heat conductive adhesive bond layer 23. The flow passage 25 is set extending from the starting point to the end point so as to fulfill the adhesive bond over the entire area of the metal plate 22.

The electrostatic chuck 20 is provided an inlet line 28, a flow passage 25, and an outlet line 29. The inlet line 28 and the outlet line 29 are formed beforehand in the base material 6, in the first layer 5, and in the metal plate 22.

As shown in the top part in FIG. 11, the metal plate 22 is set between the first layer 5 on the base material 6 and the ceramic plate 3. Firstly, fitting the inlet line 28 with a plug 27 and evacuating the inlet line 28, the flow passage 25, and the outlet line 29 by a vacuum pump (not shown) which is connected to the outlet line 29. This evacuation creates a negative pressure in the inlet line 28, the flow passage 25, and the outlet line 29. When the pressure in the inlet line 28, in the flow passage 25, and in the outlet line 29 is reached to an enough negative pressure, the outlet line 29 is also fitted with a plug 27.

Secondly, as shown in the middle part in FIG. 11, fluid-like adhesive bond is fulfilled from the inlet line 28. The adhesive bond is injected into the flow passage 25 by the effect of negative pressure and capillary phenomenon. It is desirable to stop the injection at the timing when the adhesive bond gone through the end point of the flow passage 25 and reached to the outlet line 29.

Figure 13:
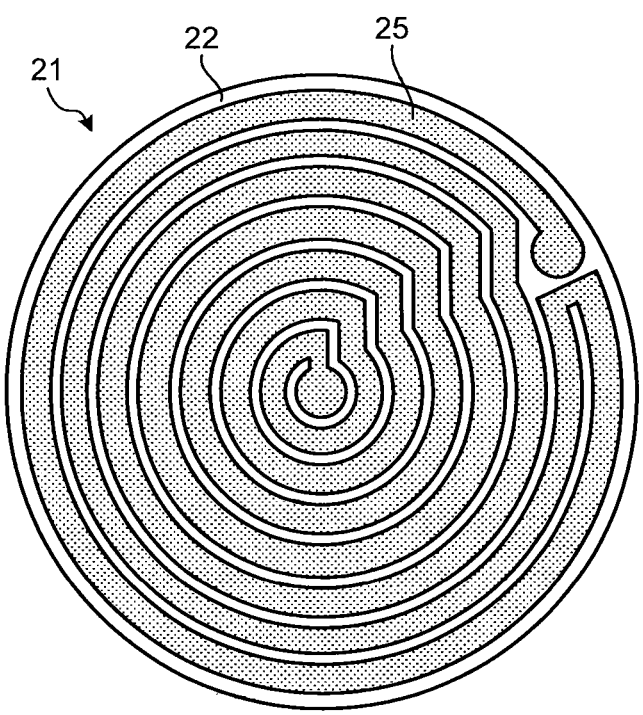
FIG. 13 is a diagram showing the state where the flow passage shown in FIG. 12 is filled with the adhesive bond.

FIG. 13 is a diagram showing the state where the flow passage shown in FIG. 12 is filled with the adhesive bond. The adhesive bond is flowed into the flow passage 25 and is spread to the entire metal plate 22.

Finally, as shown in the bottom part in FIG. 11, the inlet line and the outlet line 29 are fitted with a plug 27. The adhesive bond is solidified in this state, and the plugs 27 are removed after that. Thus, the heat conductive adhesive bond layer 23 is formed in the flow passage 25.

The method of injecting adhesive bond into the flow passage 25 is not limited to the method of the present embodiment, which uses the inlet line 28 and the outlet line 29, but any method may be used.

The heat conductive adhesive layer 24 to bond the second layer 21 and the first layer 5 together may be formed in the same way as the heat conductive adhesive bond layer 23 to bond the second layer 21 and the ceramic plate 3 together. The heat conductive adhesive bond layer 24 is also formed by filling adhesive bond into the flow passage 26 formed in the surface on the first layer 5 side of the metal plate 22.

According to the fourth embodiment, as compared with the case where the layers are bonded together by compression attachment, the occurrence of a crack in the ceramic plate 3 can be suppressed. Also, bubbles in the adhesive bond can be suppressed, so that the ceramic plate 3, the second layer 21, and the first layer 5 can be bonded together easily and uniformly.

The manufacturing method according to the present embodiment can be applied to the electrostatic chuck 30 according to the third embodiment.

Fifth Embodiment

Figure 14:
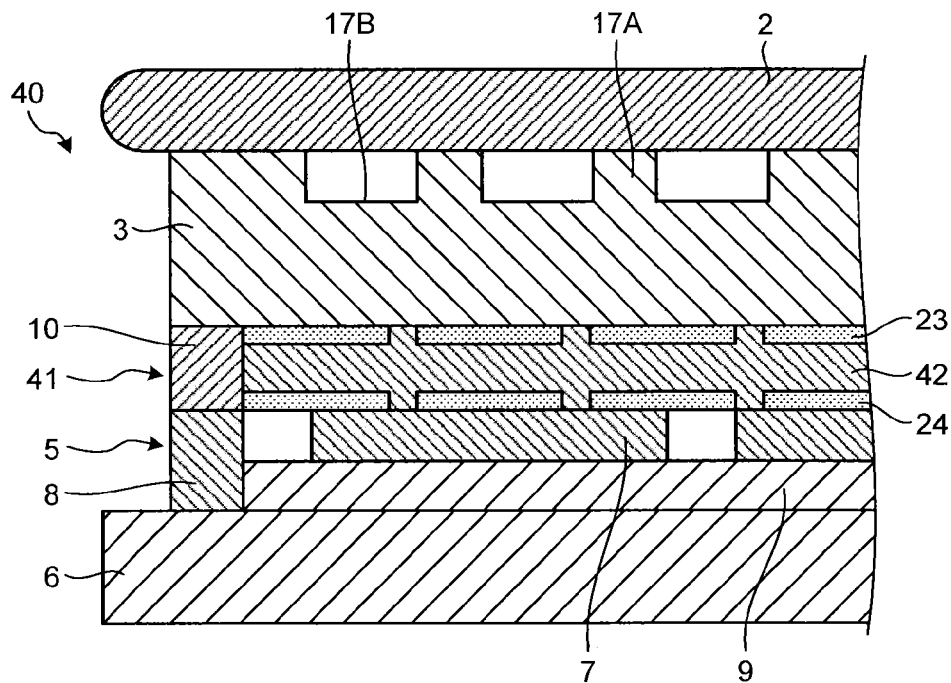
FIG. 14 is a cross-sectional view schematically showing part of the configuration of the electrostatic chuck according to a fifth embodiment.

FIG. 14 is a cross-sectional view schematically showing part of the configuration of the electrostatic chuck according to the fifth embodiment. The same reference numerals are used to denote the same parts as in the first and second embodiments, and a duplicate description is omitted as needed.

The electrostatic chuck 40 comprises a ceramic plate 3, a base material 6, a first layer 5, and a second layer 41. The base material 6, the first layer 5, and the second layer 41 form a mount plate support that supports the ceramic plate 3.

The second layer 41 is provided between the ceramic plate 3 and the first layer 5. The second layer 41 transmits heat from the heater 7 to the ceramic plate 3. The second layer 41 comprises a metal plate 42, heat conductive adhesive bond layers 23, 24, and a compressive attachment portion 10. The metal plate 42 uniformizes heat from the heater 7.

The heat conductive adhesive bond layer 23 that is a first adhesive portion is provided in the surface on the ceramic plate 3 side of the second layer 41. The surface on the ceramic plate 3 side of the second layer 41 is formed of parts of the heat conductive adhesive bond layer 23 and exposed parts of the metal plate 42 so as to form a pattern. As such, the surface on the ceramic plate 3 side of the second layer 41 is formed of the metal plate 42 and the heat conductive adhesive bond layer 23.

The heat conductive adhesive bond layer 24 that is a second adhesive portion is provided in the surface on the heater 7 side of the second layer 41. The surface on the heater 7 side of the second layer 41 is formed of parts of the heat conductive adhesive bond layer 24 and exposed parts of the metal plate 42 so as to form a pattern. As such, the surface on the first layer 5 side of the second layer 41 is formed of the metal plate 42 and the heat conductive adhesive bond layer 24.

The pattern of the metal plate 42 and the heat conductive adhesive bond layer 23 in the surface on the ceramic plate 3 side of the second layer 41 and the pattern of the metal plate 42 and the heat conductive adhesive bond layer 24 in the surface on the first layer 5 side may be the same or different as needed.

The compressive attachment portion 10 is formed at the outer edge of the second layer 41. The compressive attachment portion 10 is formed as in the first embodiment. Also in the present embodiment, the compressive attachment portion 10 is formed by deforming a metal member by pressing between the ceramic plate 3 and the heat insulating layer 8 when the second layer 41 is bonded, in between, to the ceramic plate 3 and the first layer 5.

The metal material forming the metal plate 42 is desirably high in thermal conductivity for the purpose of transmitting heat from the heater 7 to the ceramic plate 3 efficiently. Further, the difference in linear expansion coefficient between the metal plate 42 and the ceramic plate 3 is desirably small for the purpose of reducing the influence of stress due to the difference in linear expansion coefficient from the ceramic plate 3.

In the metal materials shown in FIG. 4, for example, Mo and Al—SiC are suitable as material to form the metal plate 42 in that its thermal conductivity is relatively high and that the difference in linear expansion coefficient from the ceramic plate 3 is small. Note that the metal plate 42 may be made of any metal material other than those cited as examples in the present embodiment.

According to the fifth embodiment, the electrostatic chuck 40 can elongate the life time as in the first and second embodiments. By selecting a metal material to form the metal plate 42 appropriately, the electrostatic chuck 40 can improve thermal conductivity from the heater 7 to the ceramic plate 3 and reduce the influence of stress due to the difference in linear expansion coefficient.

In the electrostatic chuck 40, the patterns of the metal plate 42 in the surface on the ceramic plate 3 side and the surface on the first layer 5 side of the second layer 41 may be made appropriate as in the third embodiment. The manufacturing method according to the fourth embodiment can be applied to the electrostatic chuck 40.

Sixth Embodiment

Figure 15:
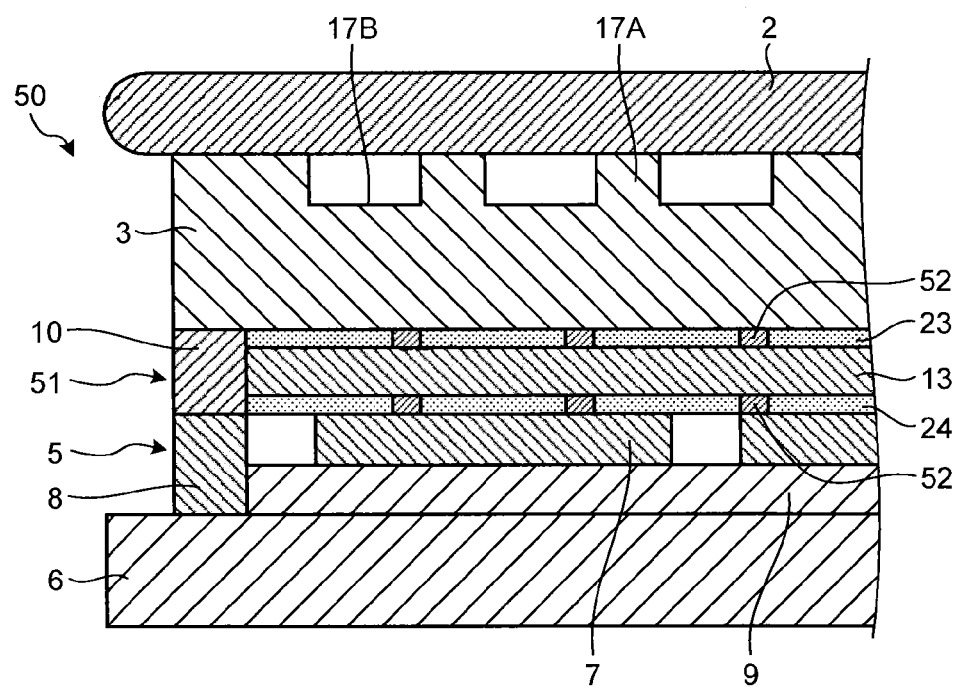
FIG. 15 is a cross-sectional view schematically showing part of the configuration of the electrostatic chuck according to a sixth embodiment.

FIG. 15 is a cross-sectional view schematically showing part of the configuration of the electrostatic chuck according to the sixth embodiment. The same reference numerals are used to denote the same parts as in the first and second embodiments, and a duplicate description is omitted as needed.

The electrostatic chuck 50 comprises a ceramic plate 3, a base material 6, a first layer 5, and a second layer 51. The base material 6, the first layer 5, and the second layer 51 form a mount plate support that supports the ceramic plate 3.

The second layer 51 is provided between the ceramic plate 3 and the first layer 5. The second layer 51 transmits heat from the heater 7 to the ceramic plate 3. The second layer 51 comprises a metal plate 13, soft metal members 52, heat conductive adhesive bond layers 23, 24, and a compressive attachment portion 10. The metal plate 13 is formed in the same way as in the first embodiment.

The heat conductive adhesive bond layer 23 that is a first adhesive portion, and the soft metal members 52 are provided in the surface on the ceramic plate 3 side of the second layer 51. The surface on the ceramic plate 3 side of the second layer 51 is formed of parts of the heat conductive adhesive bond layer 23 and parts constituted by the soft metal members 52 so as to form a pattern. As such, the surface on the ceramic plate 3 side of the second layer 51 is formed of the soft metal members 52 and the heat conductive adhesive bond layer 23.

The heat conductive adhesive bond layer 24 that is a second adhesive portion, and soft metal members 52 are provided in the surface on the first layer 5 side of the second layer 51. The surface on the first layer 5 side of the second layer 51 is formed of parts of the heat conductive adhesive bond layer 24 and parts constituted by the soft metal members 52 so as to form a pattern. As such, the surface on the first layer 5 side of the second layer 51 is formed of the soft metal members 52 and the heat conductive adhesive bond layer 24.

The compressive attachment portion 10 is formed at the outer edge of the second layer 51. The compressive attachment portion 10 is formed as in the first embodiment. Also in the present embodiment, the compressive attachment portion 10 is formed by deforming a metal member by pressing between the ceramic plate 3 and the heat insulating layer 8 when the second layer 51 is bonded, in between, to the ceramic plate 3 and the first layer 5.

When the second layer 51 is bonded the ceramic plate 3 and the first layer 5 together by pressing, the soft metal member 52 is deformed like as the compressive attachment portion 10. The soft metal members 52 provided in the surface on the ceramic plate 3 side of the second layer 51 become deformed, thereby being compressed and attached to the metal plate 13 and the ceramic plate 3. Thus, the soft metal members 52 can efficiently transmit heat from the metal plate 13 to the ceramic plate 3.

The soft metal members 52 provided in the surface on the first layer 5 side of the second layer 51 is deformed, thereby being compressed and attached to the heater 7 and the metal plate 13. Thus, the soft metal members 52 can efficiently transmit heat from the heater 7 to the metal plate 13.

The soft metal member 52 is so low in hardness as to be deformable by pressing it between the ceramic plate 3 and the first layer 5. The soft metal member 52 is desirably high in thermal conductivity for the purpose of transmitting heat from the heater 7 to the metal plate 13 and the ceramic plate 3 efficiently.

In the metal materials shown in FIG. 4, for example, high-purity Al is suitable as the soft metal member 52 in that its hardness is low and that its thermal conductivity is high. Further, using high-purity Al can reduce the influence of contaminations. The volume of the soft metal member 52 is small compared with that of the ceramic plate 3, and hence if there is a difference in linear expansion coefficient between the soft metal member 52 and the ceramic plate 3, the influence can be reduced. The soft metal members 52 may be made of any metal material other than those cited as examples in the present embodiment.

According to the sixth embodiment, the electrostatic chuck 50 can elongate the life time as in the first and second embodiments. By providing the soft metal members 52, the electrostatic chuck 50 can improve thermal conductivity from the heater 7 to the ceramic plate 3.

In the electrostatic chuck 50, the patterns of the soft metal members 52 in the surface on the ceramic plate 3 side and the surface on the first layer 5 side of the second layer 51 may be made appropriate as in the third embodiment. The manufacturing method according to the fourth embodiment can be applied to the electrostatic chuck 50.

Seventh Embodiment

Figure 16:
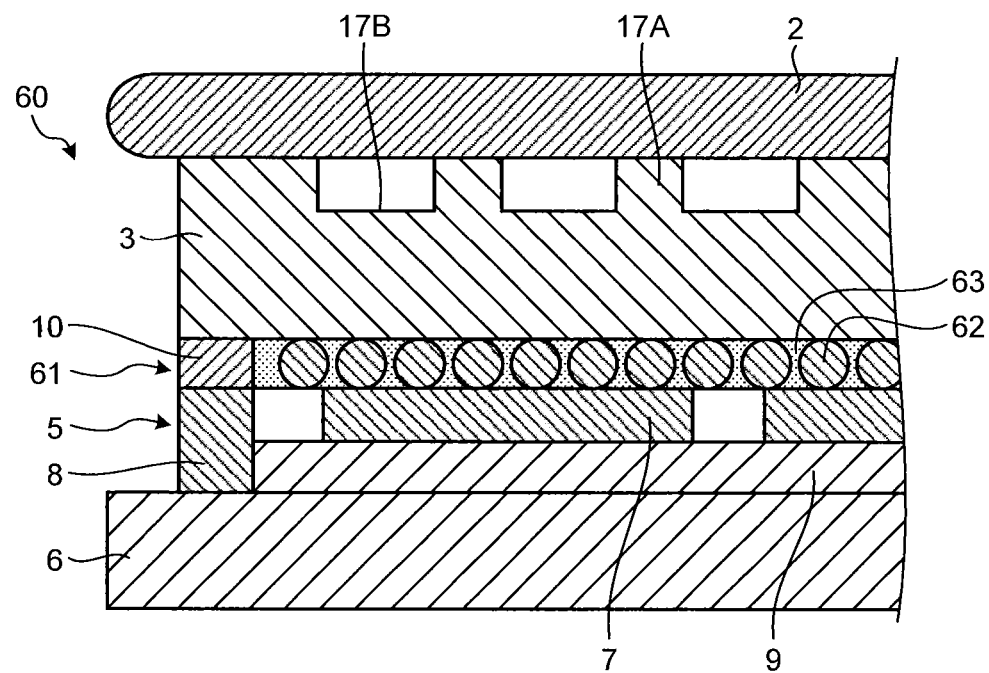
FIG. 16 is a cross-sectional view schematically showing part of the configuration of the electrostatic chuck according to a seventh embodiment.

FIG. 16 is a cross-sectional view schematically showing part of the configuration of the electrostatic chuck according to the seventh embodiment. The same reference numerals are used to denote the same parts as in the first embodiment, and a duplicate description is omitted as needed.

The electrostatic chuck 60 comprises a ceramic plate 3, a base material 6, a first layer 5, and a second layer 61. The base material 6, the first layer 5, and the second layer 61 form a mount plate support that supports the ceramic plate 3.

The second layer 61 is provided between the ceramic plate 3 and the first layer 5. The second layer 61 transmits heat from the heater 7 to the ceramic plate 3. The second layer 61 comprises a plurality of metal balls 62, a heat conductive adhesive bond layer 63, and a compressive attachment portion 10.

The compressive attachment portion 10 is formed at the outer edge of the second layer 61. The compressive attachment portion 10 is formed as in the first embodiment. When the second layer 61 is bonded the ceramic plate 3 and the first layer 5 together by pressing, the plurality of metal balls 62 are deformed like as the compressive attachment portion 10.

The metal balls 62 are laid side by side in the space among the ceramic plate 3, the first layer 5, and the compressive attachment portion 10 in the second layer 61. The space around the metal balls 62 is filled with the heat conductive adhesive bond layer 63.

The metal ball 62 may be made of any metal material having thermal conductivity. The metal ball 62 may be made of a soft metal member. Because of being deformable by pressing, the metal balls 62 are compressed and attached to the heater 7 and the ceramic plate 3. Thus, the metal balls 62 can transmit heat from the heater 7 to the ceramic plate 3 efficiently.

According to the seventh embodiment, the electrostatic chuck 60 can elongate the life time as in the first and second embodiments. By using the metal balls 62, the electrostatic chuck 60 can obtain the configuration which can transmit heat from the heater 7 to the ceramic plate 3 efficiently, by simple processing.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electrostatic chuck comprising:
a mount plate on which a work is to be mounted;
a first layer including a heater to supply heat to the work via the mount plate; and
a second layer provided between the mount plate and the first layer to transmit heat from the heater to the mount plate, wherein
the second layer includes a compressive attachment portion formed at an outer edge thereof,
the compressive attachment portion is formed of a metal member,
a face on the mount plate side of the compressive attachment portion is compressed and attached to the mount plate, and
a face on the first layer side of the compressive attachment portion is compressed and attached to the first layer.

2. The electrostatic chuck according to claim 1, wherein the second layer includes a metal plate, and
the compressive attachment portion is part of the metal plate.

3. The electrostatic chuck according to claim 1, wherein the first layer includes a heat insulating layer provided at an outer edge, and
the face on the first layer side of the compressive attachment portion is compressed and attached to the heat insulating layer.

4. The electrostatic chuck according to claim 1, wherein the second layer includes a metal plate, a first adhesive portion that bonds the metal plate and the mount plate together, and a second adhesive portion that bonds the metal plate and the first layer together,
a surface on the mount plate side of the second layer is formed of exposed parts of the metal plate and the first adhesive portion, and
a surface on the first layer side of the second layer is formed of exposed parts of the metal plate and the second adhesive portion.

5. The electrostatic chuck according to claim 4, wherein the surface on the mount plate side of the second layer is formed of the first adhesive portion and exposed parts of the metal plate so as to form a pattern, and
the surface on the first layer side of the second layer is formed of the second adhesive portion and exposed parts of the metal plate so as to form a pattern.

6. The electrostatic chuck according to claim 5, wherein the heater is placed to form a pattern in the first layer, and
the pattern of the exposed parts of the metal plate in the surface on the first layer side of the second layer coincides with the pattern of the heater.

7. The electrostatic chuck according to claim 5, wherein in a surface of the mount plate on which the work is to be mounted, a plurality of convexes to be in contact with the work mounted and concaves that are other parts of the convexes are formed, and
the pattern of the exposed parts of the metal plate in the surface on the mount plate side of the second layer coincides with a pattern of the concaves formed in the mount plate.

8. The electrostatic chuck according to claim 1, wherein the second layer includes a metal plate, a first adhesive portion that bonds the metal plate and the mount plate together, a second adhesive portion that bonds the metal plate and the first layer together, and soft metal members provided in a surface on the mount plate side and a surface on the first layer side of the metal plate,
a surface on the mount plate side of the second layer is formed of the first adhesive portion and the soft metal members so as to form a pattern, and
a surface on the first layer side of the second layer is formed of the second adhesive portion and the soft metal members so as to form a pattern.

9. A mount plate support of an electrostatic chuck which includes a mount plate on which a work is to be mounted, the mount plate support supporting the mount plate, the mount plate support comprising:
 a first layer including a heater to supply heat to the work via the mount plate; and
 a second layer provided over the first layer, wherein
 the second layer includes a compressive attachment portion formed at an outer edge thereof,
 the compressive attachment portion is formed of a metal member,
 a face on the first layer side of the compressive attachment portion is compressed and attached to the first layer, and
 a face of the compressive attachment portion opposite to the first layer side is a compressive attachment surface for the mount plate to be fixed onto the second layer.

10. The mount plate support according to claim 9, wherein
 the second layer includes a metal plate, and
 the compressive attachment portion is part of the metal plate.

11. The mount plate support according to claim 9, wherein
 the first layer includes a heat insulating layer provided at an outer edge, and
 the face on the first layer side of the compressive attachment portion is compressed and attached to the heat insulating layer.

12. The mount plate support according to claim 9, wherein
 the second layer includes a metal plate, a first adhesive portion that bonds the metal plate and the mount plate together, and a second adhesive portion that bonds the metal plate and the first layer together,
 a surface on the mount plate side of the second layer is formed of exposed parts of the metal plate and the first adhesive portion, and
 a surface on the first layer side of the second layer is formed of exposed parts of the metal plate and the second adhesive portion.

13. The mount plate support according to claim 12, wherein
 the surface on the mount plate side of the second layer is formed of the first adhesive portion and exposed parts of the metal plate so as to form a pattern, and
 the surface on the first layer side of the second layer is formed of the second adhesive portion and exposed parts of the metal plate so as to form a pattern.

14. A manufacturing method of an electrostatic chuck comprising:
 bonding a second layer to a first layer including a heater; and
 bonding a mount plate on which a work is to be mounted to a surface opposite to a surface of the second layer bonded to the first layer, wherein
 the second layer is prepared such that, of its outer edge, part to abut on the first layer and part to abut on the mount plate are both a protrusion and that the second layer is thicker at the outer edge than at the other part than the outer edge,
 when the second layer is bonded to the first layer and the mount plate is to the second layer, the outer edge of the second layer is compressed and attached to the first layer by pressing the protrusion against the first layer to deform, and the outer edge of the second layer is compressed and attached to the mount plate by pressing the protrusion against the mount plate to deform.

15. The manufacturing method of the electrostatic chuck according to claim 14, wherein
 the outer edge of the second layer is formed of a metal member,
 the outer edge of the second layer is compressed and attached to the first layer by pressing the protrusion formed of the metal member against the first layer to deform, and
 the outer edge of the second layer is compressed and attached to the mount plate by pressing the protrusion formed of the metal member against the mount plate to deform.

16. The manufacturing method of the electrostatic chuck according to claim 14, wherein
 the outer edge of the second layer is part of a metal plate included in the second layer,
 the outer edge of the second layer is compressed and attached to the first layer by pressing the protrusion that is part of the metal plate against the first layer to deform, and
 the outer edge of the second layer is compressed and attached to the mount plate by pressing the protrusion that is part of the metal plate against the mount plate to deform.

17. The manufacturing method of the electrostatic chuck according to claim 14, wherein
 a flow passage to fill an adhesive bond into is formed in the surface on the mount plate side of the second layer, and
 the adhesive bond is made to flow into the flow passage, thereby bonding the second layer and the mount plate together.

18. The manufacturing method of the electrostatic chuck according to claim 14, wherein
 a flow passage to fill an adhesive bond into is formed in the surface on the first layer side of the second layer, and
 the adhesive bond is made to flow into the flow passage, thereby bonding the second layer and the first layer together.

* * * * *